(12) United States Patent
Park

(10) Patent No.: US 12,262,504 B2
(45) Date of Patent: Mar. 25, 2025

(54) POWER MODULE

(71) Applicant: LG INNOTEK CO., LTD., Seoul (KR)

(72) Inventor: Sung June Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 181 days.

(21) Appl. No.: 18/018,931

(22) PCT Filed: Aug. 2, 2021

(86) PCT No.: PCT/KR2021/010055
§ 371 (c)(1),
(2) Date: Jan. 31, 2023

(87) PCT Pub. No.: WO2022/025731
PCT Pub. Date: Feb. 3, 2022

(65) Prior Publication Data
US 2024/0040739 A1 Feb. 1, 2024

(30) Foreign Application Priority Data
Jul. 31, 2020 (KR) .................. 10-2020-0095712

(51) Int. Cl.
*H05K 7/20* (2006.01)
(52) U.S. Cl.
CPC ..... *H05K 7/20172* (2013.01); *H05K 7/20154* (2013.01)
(58) Field of Classification Search
CPC ............. H05K 7/20172; H05K 5/0247; H05K 7/20154; H05K 5/0204; H05K 5/0221;
(Continued)

(56) References Cited

U.S. PATENT DOCUMENTS 6,373,698 B1 * 4/2002 Christensen .............. G06F 1/20
361/679.48
6,556,437 B1 * 4/2003 Hardin ............... H05K 7/20172
361/679.48
(Continued)

FOREIGN PATENT DOCUMENTS

WO WO 02/065261 A1 8/2002

OTHER PUBLICATIONS

Power Supply Unit With A Fan That Can Be Removed From The Outside, Enermax technology, ESPACENET translation (Year: 2009).*
(Continued)

*Primary Examiner* — Michael A Matey
(74) *Attorney, Agent, or Firm* — Birch, Stewart, Kolasch & Birch, LLP

(57) ABSTRACT

The present embodiment relates to a power module frame comprising a first frame side plate and a second frame side plate, which face each other and are in contact with at least parts of both side plates of a fan module when the frame side plates are coupled to the fan module, respectively, wherein the first frame side plate and the second frame side plate comprise: at least one fastening groove coupled to a catching part formed on the both side plates of the fan module; guide parts extending by a predetermined length from the lower ends of the first frame side plate and the second frame side plate to face each other, to support the lower surface of the fan module; and a screw-fastening part for coupling the first frame side plate to the fan module.

18 Claims, 13 Drawing Sheets

(58) Field of Classification Search
CPC ............ H05K 7/20581; H05K 5/0208; H05K 5/0213; H05K 5/0256; H05K 7/12; H05K 7/1409; H05K 7/14325; H05K 7/20136; H05K 7/20145; H05K 7/20736; G06F 1/20; G06F 1/183; G06F 1/188; G06F 1/18; G06F 1/181; G06F 1/182; H01R 13/743; H01R 13/748; H01R 33/97
See application file for complete search history.

(56) References Cited

U.S. PATENT DOCUMENTS

| | | | | |
|---|---|---|---|---|
| 6,592,327 | B2 * | 7/2003 | Chen | F04D 29/646 415/213.1 |
| 6,611,427 | B1 | 8/2003 | Liao | |
| 6,674,641 | B2 * | 1/2004 | Jensen | G06F 1/20 361/679.48 |
| 6,731,502 | B1 * | 5/2004 | Hsu | H05K 7/20727 361/679.48 |
| 6,999,313 | B2 * | 2/2006 | Shih | H05K 7/20172 165/104.33 |
| 7,021,895 | B2 * | 4/2006 | Rubenstein | F04D 29/541 415/207 |
| 7,515,413 | B1 | 4/2009 | Curtis | |
| 7,839,638 | B2 * | 11/2010 | Ye | G06F 1/20 415/214.1 |
| 8,721,276 | B2 * | 5/2014 | Lu | F04D 25/0613 415/213.1 |
| 8,873,236 | B1 * | 10/2014 | Tamarkin | F04D 29/601 361/679.48 |
| 10,426,052 | B1 * | 9/2019 | Tai | H05K 7/12 |
| 2003/0099094 | A1 * | 5/2003 | Coles | H05K 7/1409 361/679.33 |
| 2006/0120040 | A1 * | 6/2006 | Chen | H05K 7/20172 361/695 |
| 2006/0285292 | A1 * | 12/2006 | Fan | H05K 7/20172 361/695 |
| 2007/0121290 | A1 * | 5/2007 | Chou | G06F 1/20 361/695 |
| 2007/0153477 | A1 * | 7/2007 | Liang | G06F 1/20 361/695 |
| 2013/0058781 | A1 * | 3/2013 | Fu | H05K 7/20581 415/220 |
| 2013/0149168 | A1 * | 6/2013 | Sun | H05K 7/20172 416/244 R |
| 2013/0168530 | A1 * | 7/2013 | Lu | G06F 1/20 248/678 |
| 2013/0287544 | A1 * | 10/2013 | Ma | G06F 1/20 415/60 |
| 2016/0305451 | A1 * | 10/2016 | Huang | F04D 25/0613 |
| 2017/0023990 | A1 | 1/2017 | Huang et al. | |
| 2017/0042060 | A1 * | 2/2017 | Chen | F04D 25/0613 |
| 2020/0303883 | A1 * | 9/2020 | Li | H05K 7/1492 |
| 2022/0174837 | A1 * | 6/2022 | Antaran | H05K 7/1492 |
| 2024/0114648 | A1 * | 4/2024 | Yu | H05K 7/20209 |

OTHER PUBLICATIONS

Espacenet translate, DE-202009003551-U1, Power Supply Unit With A Fan That Can Be Removed From The Outside (Year: 2009).*

* cited by examiner

POWER MODULE

CROSS REFERENCE TO RELATED APPLICATIONS

This application is the National International Application Phase of PCT No. PCT/KR2021/010055, filed on Aug. 2, 2021, which claims priority under 35 U.S.C. 119(a) to Patent Application No. 10-2020-0095712, filed in the Republic of Korea on Jul. 31, 2020, all of which are hereby expressly incorporated by reference into the present application.

TECHNICAL FIELD

The present embodiment is related to a power module.

BACKGROUND ART

In general, a power supply unit is widely used as a power supply device. Components such as a fan module, an AC socket, a PFC switch, and a DCDC converter are mounted on the power supply unit.

Recently, as the power consumption of the power supply unit increases, there is a problem in that the speed at which the power supply unit overheats increases. To this end, a fan module may be coupled to the power supply unit, and the size or number of fans may vary according to power consumption of the power supply unit.

At this time, the need for designing a fan module frame and a power module frame compatible with the same power supply unit even if the number of fans being coupled to the fan module is different has increased.

DETAILED DESCRIPTION OF THE INVENTION

Technical Subject

Through the present embodiment, it is to provide a fan module frame and a power module frame that can be applied regardless of the fan type.

Technical Solution

A power module frame according to the present embodiment may comprise a first frame side plate and a second frame side plate, which face each other and are in contact with at least parts of both side plates of a fan module when the frame side plates are coupled to the fan module, respectively, wherein the first frame side plate and the second frame side plate comprise: at least one fastening groove being coupled to a catching part formed on the both side plates of the fan module; guide parts being extended by a predetermined length from lower ends of the first frame side plate and the second frame side plate to face each other, to support the lower surface of the fan module; and a screw-fastening part for coupling the first frame side plate to the fan module.

In addition, the fastening groove is that the width of a part of the fastening groove where the catching protrusion of the catching part is located may be wider than the width of the catching protrusion when the fastening groove is combined with the catching part.

In addition, the lower plate of the power module frame is opened corresponding to the region into which the fan module is inserted, and an end portion of a lower end of the power module frame may be in contact with one surface of the fan module.

In addition, the fastening grooves may be formed at positions facing each other on both side plates of the fan module.

In addition, the first frame side plate may include first and second fastening grooves, and the center of the screw-fastening part may be disposed on an axis of symmetry of the first fastening groove.

A power supply device according to the present embodiment includes a power module; and a fan module being coupled to the power module, wherein the power module includes a first frame side plate and a second frame side plate being in contact with the fan module and facing each other, wherein the fan module comprises: one or more fans; a first fan module side plate and a second fan module side plate being formed on both side surfaces of the fan and facing each other; and a third fan module plate being formed by connecting one end of the first fan module side plate and one end of the second fan module side plate, and wherein the first fan module side plate and the second fan module side plate may include at least one catching part being fit-coupled into the fastening grooves being formed on the first frame side plate and the second frame side plate.

In addition, the catching part may be extended outward from the first fan module side plate or the second fan module side plate at a predetermined angle.

In addition, the first fan module side plate and the second fan module side plate may have different lengths according to the number of fans.

In addition, the first fan module side plate and the second fan module side plate may have different lengths in a direction being coupled to the power module frame, but the position of the catching part may be the same.

In addition, the first fan module side plate may include a hole being fastened with a screw when the fan module and the first frame side plate are coupled.

Advantageous Effects

Through the present embodiment, the structure of the fan module frame and the power module frame applicable regardless of the number of fans being coupled to the fan module can be commonized.

In addition, performance tests can be performed by changing the fan type or fan specifications as needed in a power module of completed design, and rapid mass production of a derivative model with a changed fan type may be possible.

In addition, the process of assembling the fan module and the power module is easy, and the process of inserting the fan into the fan module and fastening with screws can be performed in advance, so the time of the main process of power module production can be shortened.

In addition, while applying a large size AC socket, it is possible to provide a power module in which LEDs and levers can be efficiently mounted in a smaller space than before.

In addition, LED can be used as a general-purpose product without being manufactured in a separate modular form, which can be advantageous for cost reduction and product commonization.

In addition, a power module for easy assembling process can be provided by bending and assembling of the power module frame and using a bracket that is easy to attach and detach.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Hereinafter, a power module 10 according to an embodiment of the present invention will be described in more detail with reference to the accompanying drawings.

Figure 1:
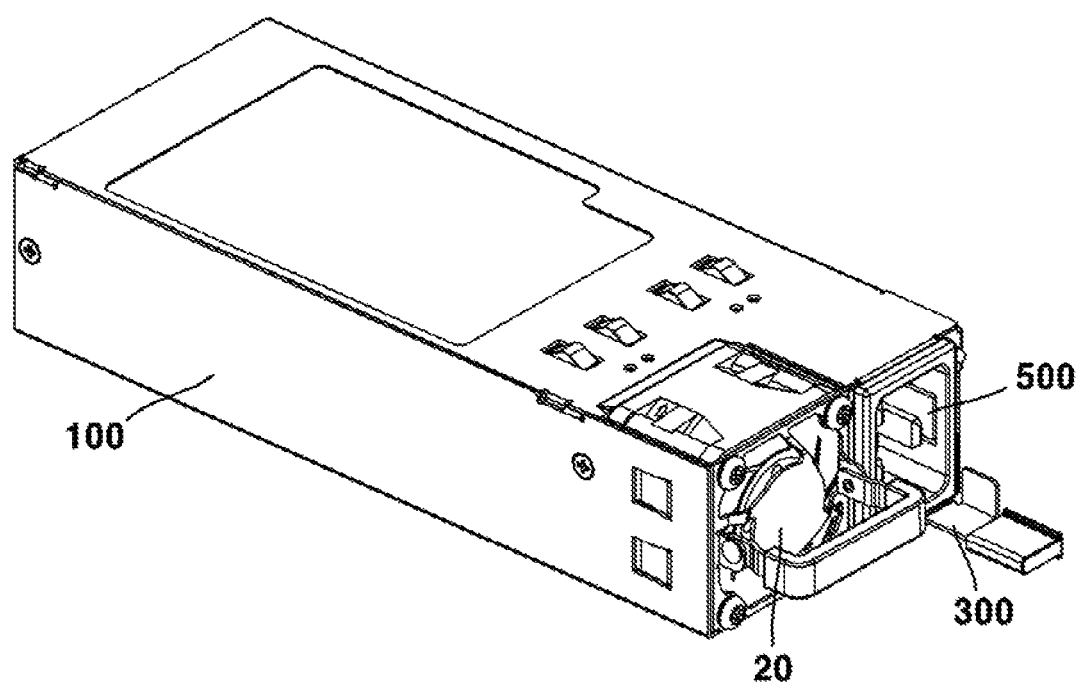
FIG. 1 is a perspective view of a power module coupled to a single fan module according to a present embodiment.
Figure 2:
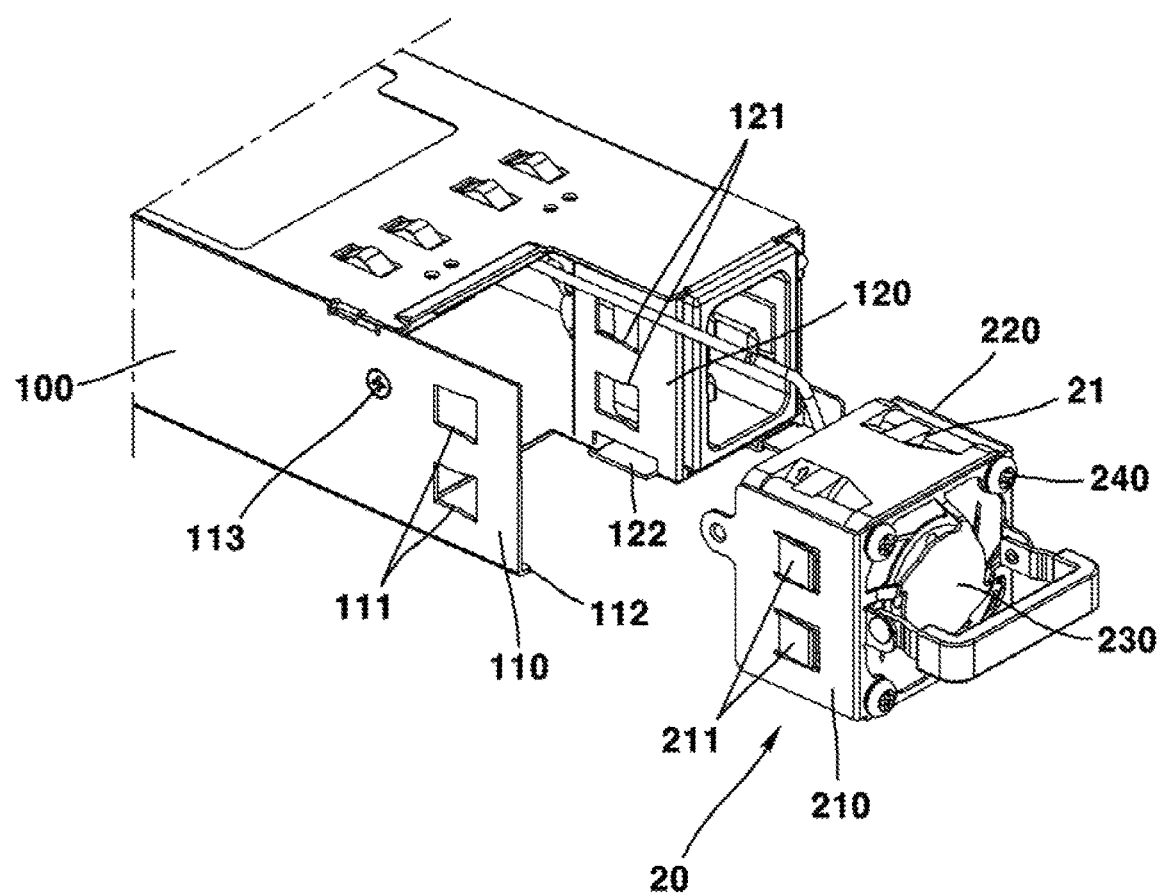
FIG. 2 is a perspective view of a single fan module separated from a power module according to the present embodiment.
Figure 3:
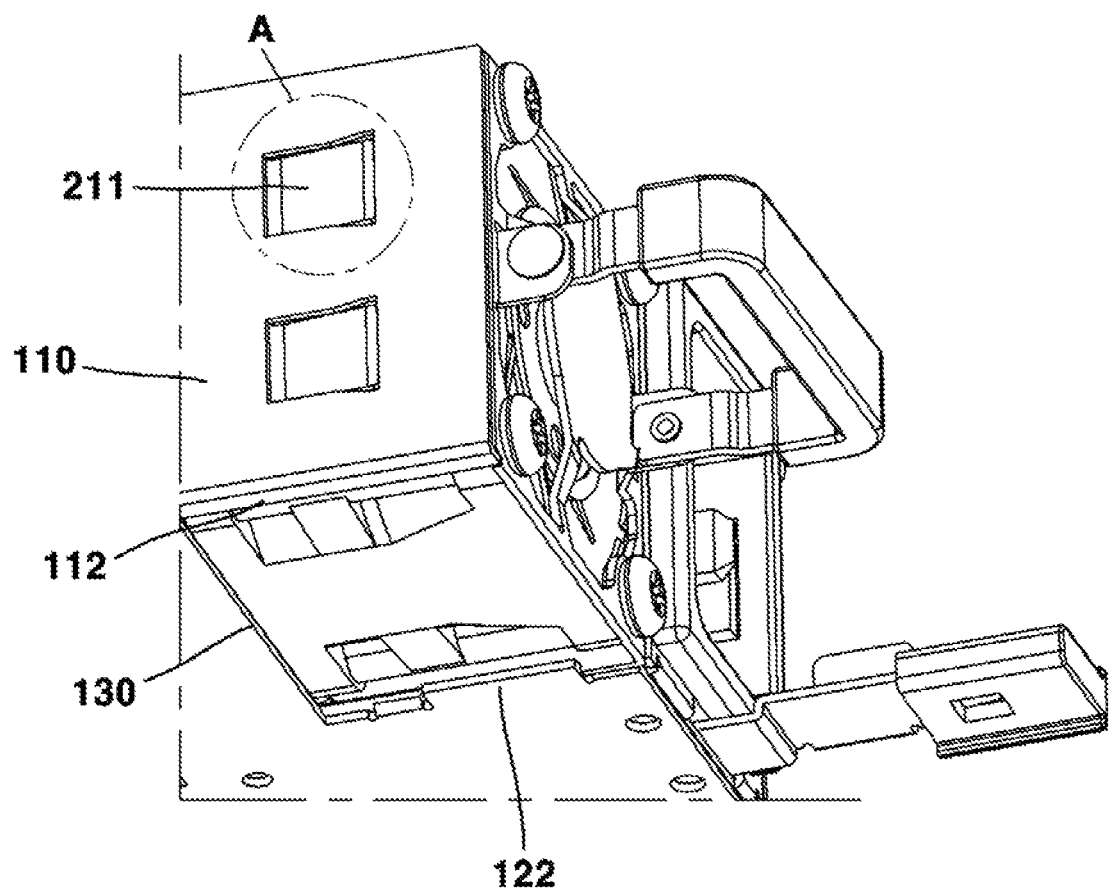
FIG. 3 is a perspective view of a power module according to the present embodiment viewed from the bottom.
Figure 4:
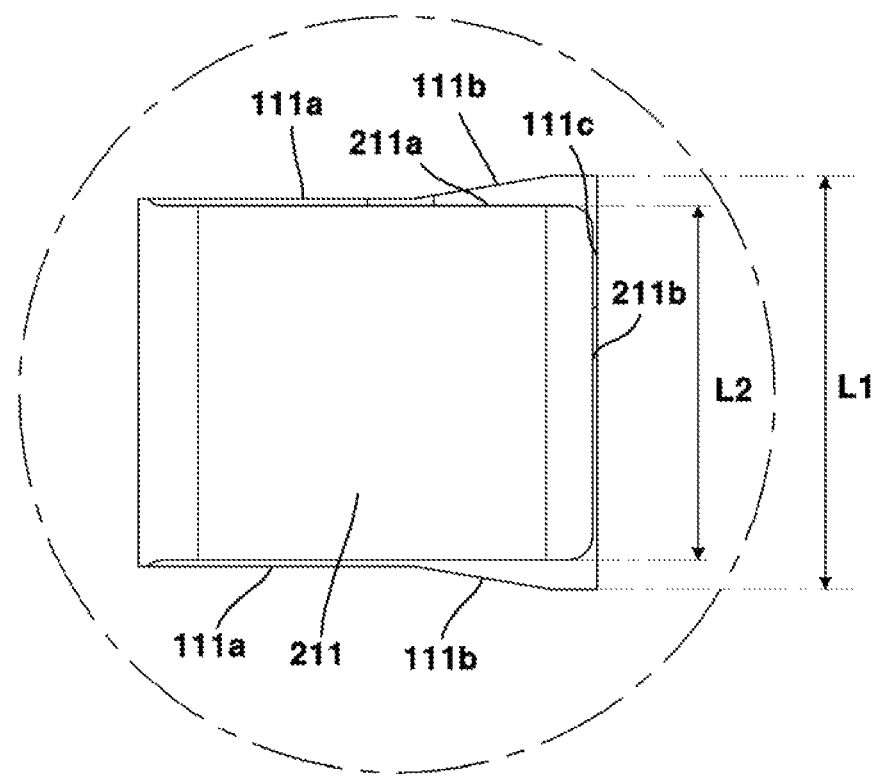
FIG. 4 is an enlarged view of part A.
Figure 5:
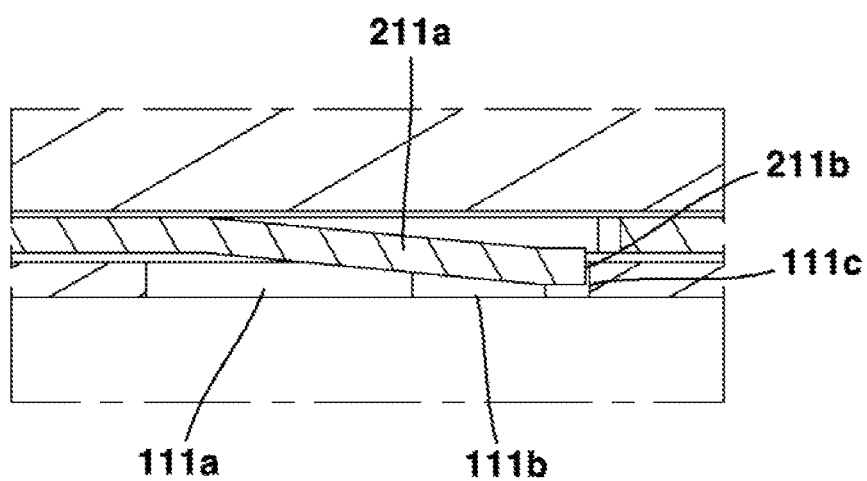
FIG. 5 is an enlarged view of part A as viewed from above.
Figure 6:
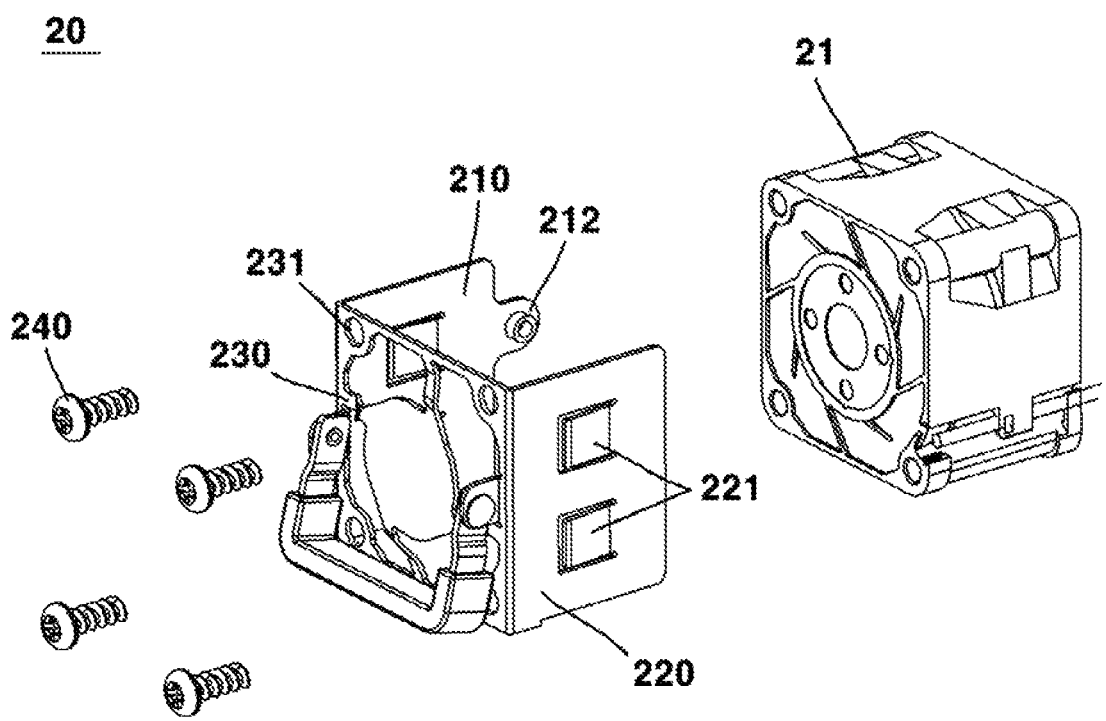
FIG. 6 is an exploded perspective view of a single fan module according to the present embodiment.
Figure 7:
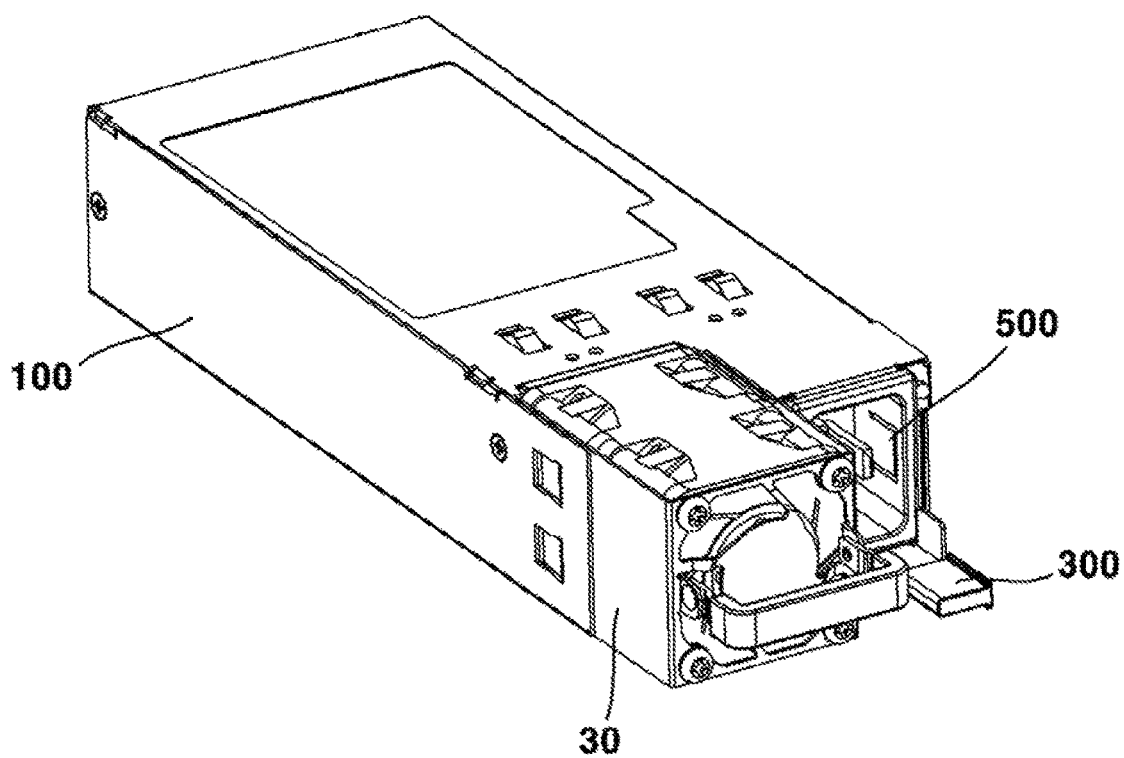
FIG. 7 is a perspective view of a power module coupled to a double fan module according to the present embodiment.
Figure 8:
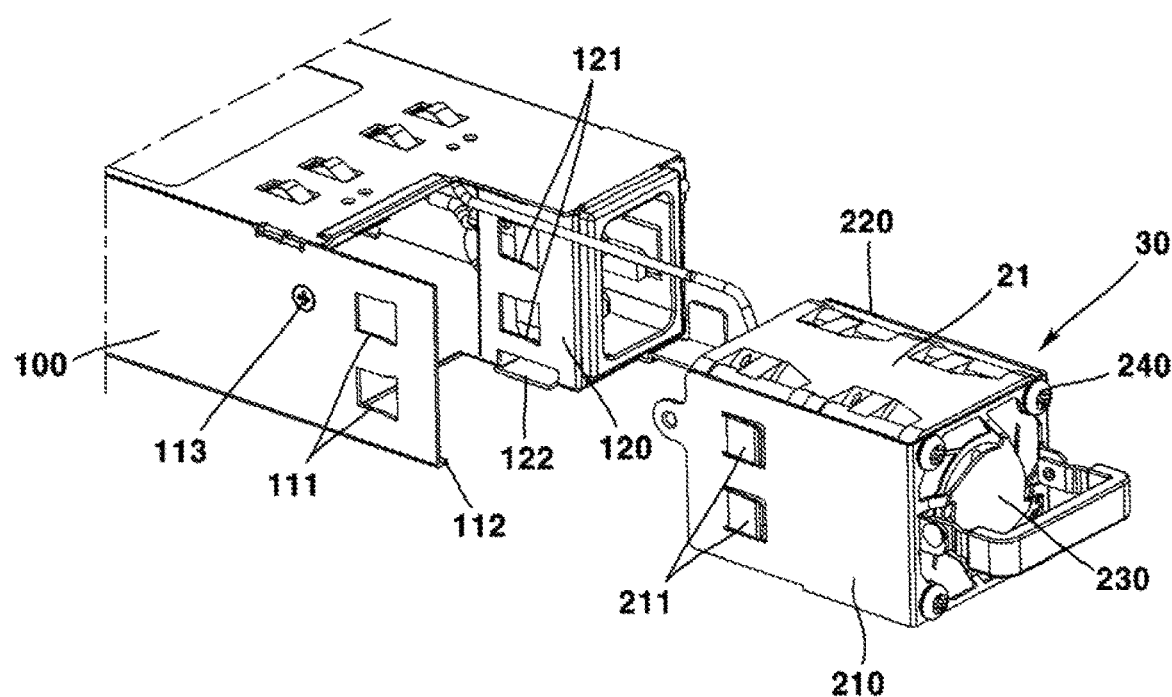
FIG. 8 is a perspective view of a double fan module separated from a power module according to the present embodiment.
Figure 9:
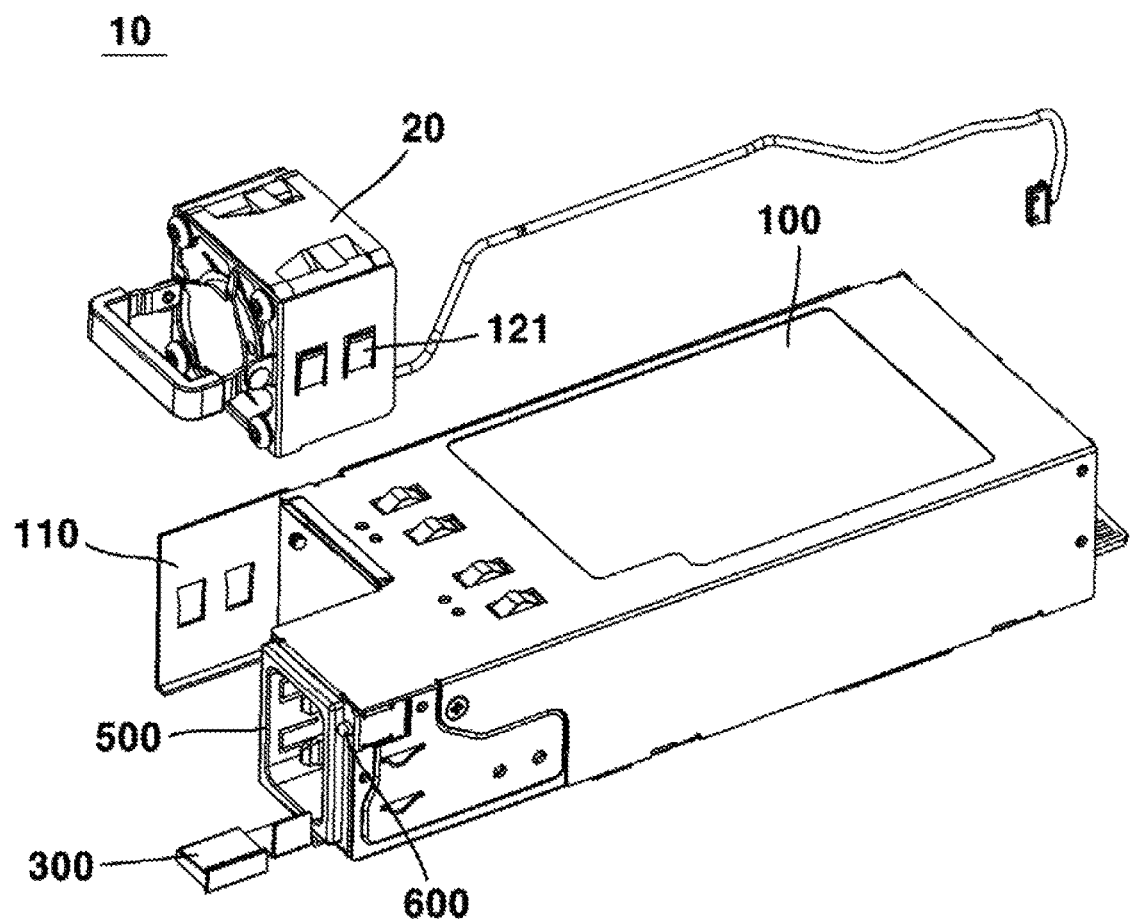
FIG. 9 is a perspective view of a single fan module separated from a power module according to another embodiment of the present invention.
Figure 10:
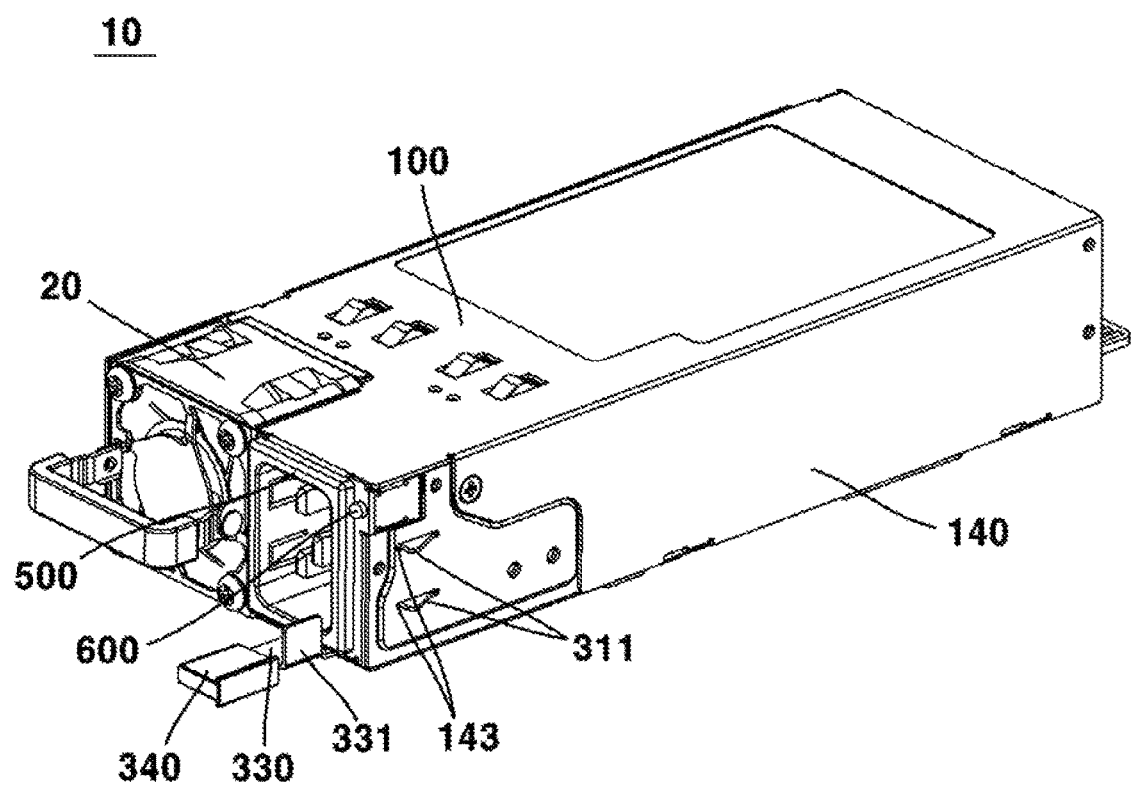
FIG. 10 is a perspective view of a power module according to a present embodiment viewed from another angle.
Figure 11:
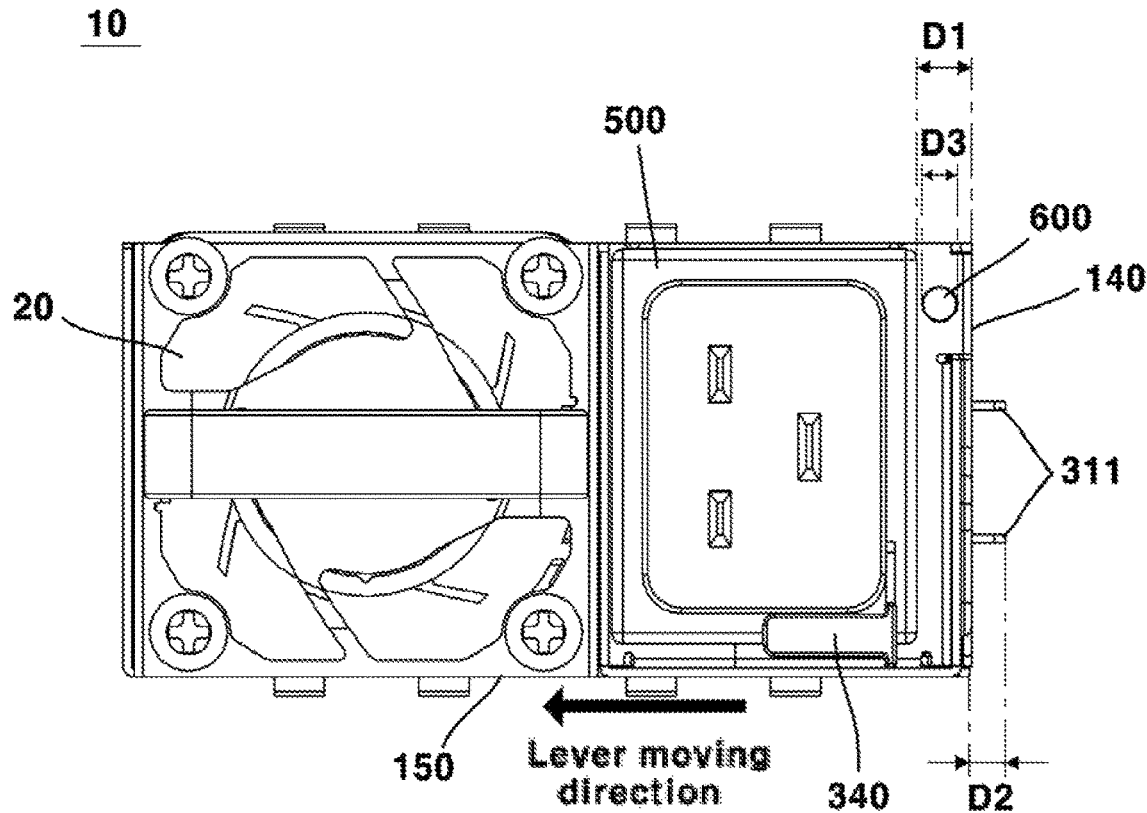
FIG. 11 is a front view of a power module according to a present embodiment.
Figure 12:
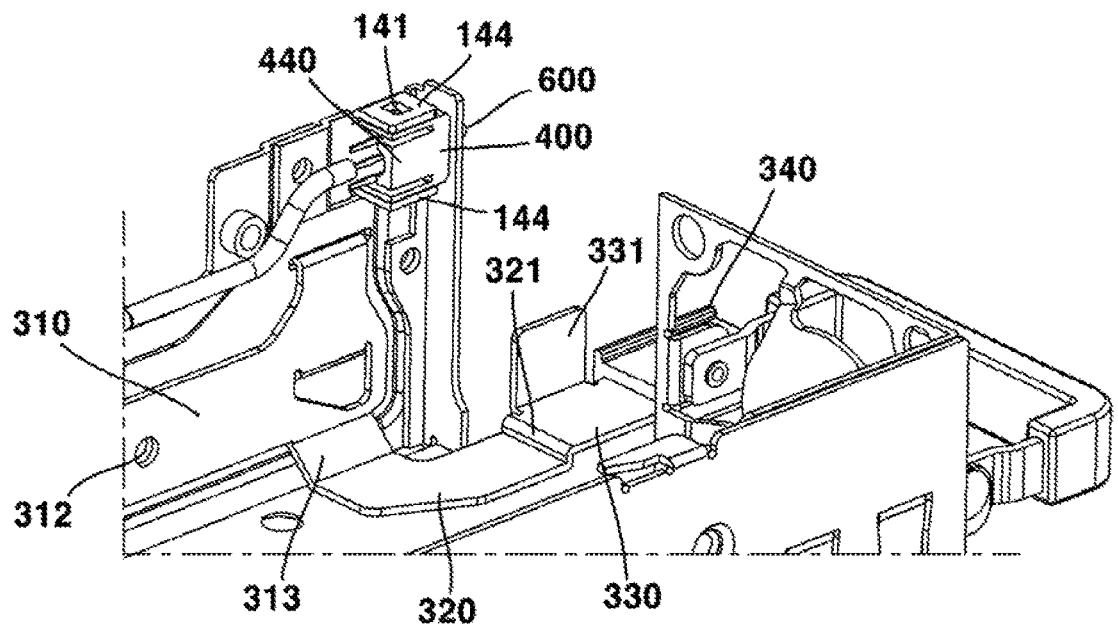
FIG. 12 is a perspective view of a partial configuration of a power module according to a present embodiment.
Figure 13:
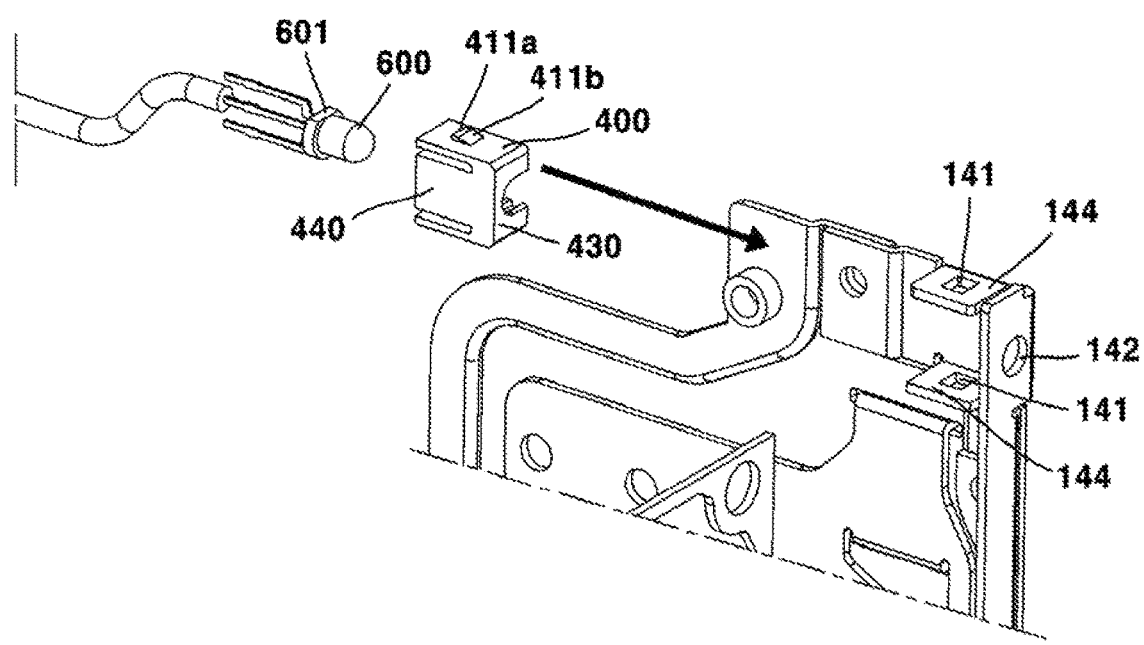
FIG. 13 is an exploded perspective view of a bracket according to the present embodiment.
Figure 14:
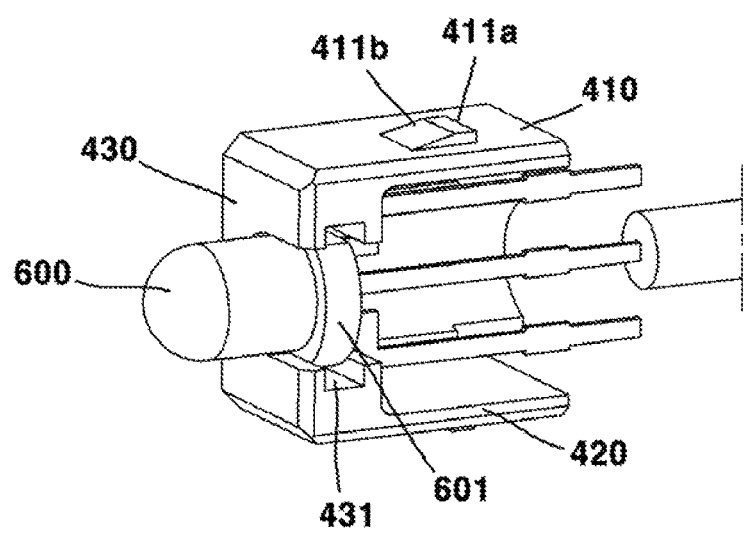
FIG. 14 is a perspective view of a bracket according to the present embodiment.
Figure 15:
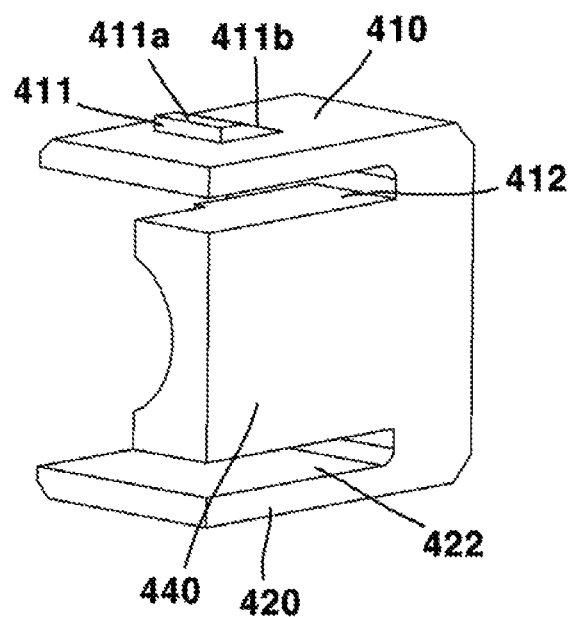
FIG. 15 is a perspective view of a bracket viewed from another angle according to a present embodiment.
Figure 16:
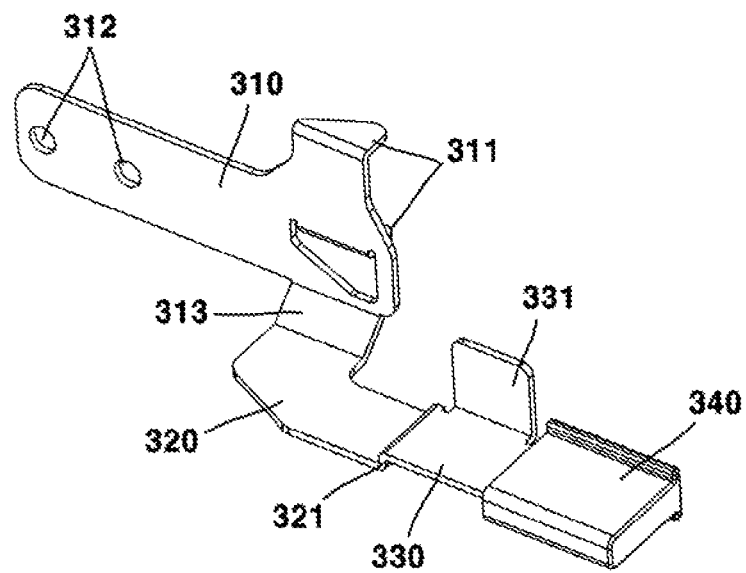
FIG. 16 is a perspective view of a lever according to a present embodiment.

FIG. 1 is a perspective view of a power module coupled to a single fan module according to a present embodiment; FIG. 2 is a perspective view of a single fan module separated from a power module according to the present embodiment; FIG. 3 is a perspective view of a power module according to the present embodiment viewed from the bottom; FIG. 4 is an enlarged view of part A; FIG. 5 is an enlarged view of part A as viewed from above; FIG. 6 is an exploded perspective view of a single fan module according to the present embodiment; FIG. 7 is a perspective view of a power module coupled to a double fan module according to the present embodiment; FIG. 8 is a perspective view of a double fan module separated from a power module according to the present embodiment; FIG. 9 is a perspective view of a single fan module separated from a power module according to another embodiment of the present invention; FIG. 10 is a perspective view of a power module according to a present embodiment viewed from another angle; FIG. 11 is a front view of a power module according to a present embodiment; FIG. 12 is a perspective view of a partial configuration of a power module according to a present embodiment; FIG. 13 is an exploded perspective view of a bracket according to the present embodiment; FIG. 14 is a perspective view of a bracket according to the present embodiment; FIG. 15 is a perspective view of a bracket viewed from another angle according to a present embodiment; FIG. 16 is a perspective view of a lever according to a present embodiment; and FIG. 17 is a cross-sectional view of a power module according to a present embodiment.

The power module 10 according to an embodiment of the present invention may be a power supply device. The power module 10 may be a power supply unit (PSU). The power module 10 may be a power circuit device that generates required output power from input power. The power module 10 is a device that supplies power necessary for driving the server, and may be a device that converts input commercial AC power into DC power required for the server and outputs the converted power. The power module 10 may be used in a server, storage, rack, and network equipment included in a data center.

Figure 17:
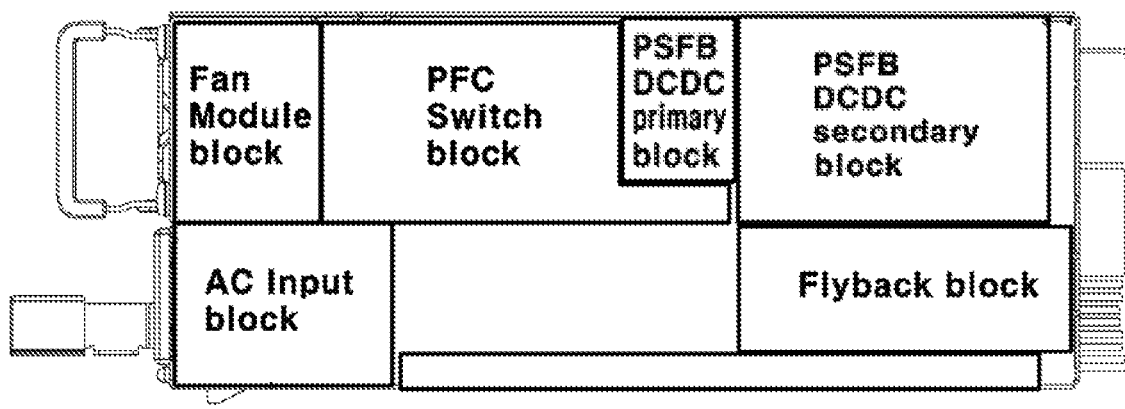
FIG. 17 is a cross-sectional view of a power module according to a present embodiment.

Referring to FIG. 17 illustrating a cross-sectional view of a power module 10, the power module 10 may include components such as a fan module, an AC socket, a PFC switch, a PSFP DCDC converter, and a flyback converter, and according to the size and mounting position, each component can affect each other. Accordingly, the overall size of the power module 10 may vary.

The fan module 20 may cool or discharge heat generated during operation of the power module 10 to the outside. Depending on the power consumption of the power module 10, a single fan module 20 or a double fan module 20 may be coupled to the power module 10. The number of fans may increase or decrease according to the power consumption of the power module 10, and the number of coupled fans may not be particularly limited thereto.

The power module 10 may include a power module frame 100. The power module frame 100 may form the outer appearance of the power module 10. The power module frame 100 may be formed in a hexahedral shape. However, it is not limited thereto and the shape of the power module frame 100 may be variously changed.

The power module frame 100 may include a first frame side plate 110 and a second frame side plate 120. The first frame side plate 110 may be disposed in the side plate forming the outer appearance of the power module frame 10. The second frame side plate 120 may be disposed inside the power module frame 100. The second frame side plate 120 may separate a region where the fan module 20 is inserted and a region where the AC socket 500 is inserted. The first and second frame side plates 110 and 120 may be disposed to face each other. The first and second frame side plates 110 and 120 may be disposed in parallel.

The lower plate 150 and the upper plate of the power module frame 100 may be opened corresponding to a region where the fan module 20 is inserted. The power module frame 100 may include an end portion 130 of the lower plate 150 of the power module frame 100 connecting the first and second frame side plates 110 and 120 to a bottom surface. The end portion 130 may be in contact with the fan module 20 in a sliding direction when the fan module 20 is slidably coupled to the power module frame 100. When the fan module 20 is coupled with the power module frame 100, the end portion 130 may prevent the movement of the fan module 20 in the rearward direction of the power module frame 10 as one surface of the end portion 130 supports one surface of the fan module 20.

The first frame side plate 110 may include at least one first fastening groove 111. One first fastening groove 111 may be disposed at the center of the first frame side plate 110, and when there are two first fastening grooves 111, the two first fastening grooves 111 may be symmetrically disposed on the first frame side plate 110.

The fan module 20 may include a fan module frame 200. The fan module frame 200 may form the outer appearance of the fan module 20 and may be variously changed according to the shape of a fan 21. In addition, the fan module frame 200 may include a first fan module side plate 210 and a second fan module side plate 220 being formed on both sides of the fan 21 and facing each other. The first and second fan module side plates 220 may be disposed in parallel.

The first fan module side plate 210 may include at least one first catching part 211. One first catching part 211 may be disposed at the center of the first fan module side plate 210, and when there are two first catching parts 211, the two first catching parts 211 may be symmetrically disposed on the first fan module side plate 210, but are not particularly limited thereto. The first catching part 211 may be formed at a position corresponding to the first fastening groove 111 of the first frame side plate 110.

Referring to FIG. 4 illustrating an enlarged view of part A where the first fastening groove 111 and the first catching part 211 are coupled, the first fastening groove 111 can be fit-coupled with the first catching part 211. The fan module 20 may not be separated towards the front surface direction of the power module frame 10 by the first catching part 211 coupled to the first fastening groove 111. The shape of the first fastening groove 111 may be formed to be larger than that of the first catching part 211. The first catching part 211 may have a rectangular shape, but is not particularly limited thereto.

A first portion 111a and a second portion 111b of the first fastening groove 111 may be disposed at positions facing a first surface 211a of the first catching part 211. The first portion 111a and the second portion 111b of the first fastening groove 111 may form a predetermined angle. The first portion 111a of the first fastening groove 111 may be overlapped with the first surface 211a of the first catching part 211, and the second portion 111b of the first fastening groove 111 may be disposed spaced apart from the first surface 211a of the first catching part 211 by a predetermined distance. The first surface 211a of the first catching part 211 is overlapped with the first portion 111a of the first fastening groove 111 so that the up and down movement may be restricted. When the first catching part 211 is coupled with the first fastening groove 111, the first fastening groove 111 may form a region not being overlapped with the first catching part 211 by the second portion 111b. When the fan module 20 is slidably coupled to the power module frame 100, the first portion 111b of the first fastening groove 111 may guide the first catching part 211 so that it can be coupled to the correct position despite the positional deviation of each component. In addition, even if tolerances occur during the manufacturing process of each frame, the catching part can be accommodated in the right position of the fastening groove, and can be coupled and fixed.

The first catching part 211 may include a second surface 211b perpendicular to the first surface 211a. A third portion 111c of the first fastening groove 111 may be disposed at a position facing the second surface 211b of the first catching part 211. The width L1 of the third portion 111c of the first fastening groove 111 may be greater than the width L2 of the second surface 211b of the first catching part 211. The second surface 211b of the first catching part 211 may include a catching protrusion. When the first fastening groove 111 is coupled with the first catching part 211, the width L1 of a portion of the first fastening groove 111 where the catching protrusion of the first catching part 211 is located may be wider than the width L2 of the catching protrusion of the first catching part 211. Through this, even if a tolerance occurs during the manufacturing process of each frame, the catching part can be accommodated in the right position of the fastening groove, and can be coupled and fixed.

The second frame side plate 120 includes a second fastening groove 121, and since the detailed description of the second frame side plate 120 and the second fastening groove 121 is corresponding to the detailed description of the first frame side plate 110 and the first fastening groove 111, the overlapping descriptions are omitted.

The first catching part 211 may be formed in a quadrangular shape, one side of the first catching part 211 may be connected to the first fan module side plate 210, and the remaining three surfaces may be spaced apart from the first fan module side plate 210 by a predetermined distance. One surface of the first catching part 211 being connected to the first fan module side plate 210 may be a front surface in a direction in which the fan module 20 is slidably coupled to the power module frame 100.

Referring to FIG. 5 viewed from above by enlarging the portion A where the first fastening groove 111 and the first catching part 211 are coupled, the first catching part 211 may be extended at a predetermined angle toward the outside of the first fan module side plate 210. The first catching part 211 may elastically move toward the fan 21 being disposed inside the fan module 20. The first catching part 211 may form a predetermined angle with the first fan module side plate 210, and the predetermined angle may be formed so that the second surface 211b of the first catching part 211 is at least partially overlapped with the third portion 111c of the first fastening groove 111. The position where the first catching part 211 forms a predetermined angle, that is, the position where it is bent may be formed close to the second surface 211b of the first catching part 211, or it may be formed far from the second surface 211b of the first catching part 211. The degree of elasticity of the first catching part 211 may vary according to the bending position of the first catching part 211.

One end of the first catching part 211 may include a catching protrusion being overlapped with the first fastening groove 111. When the fan module 20 is slidably coupled to the power module frame 100, the first catching part 211 is elastically moved towards the fan 21 and then may be moved back to its original position when fit-coupled into the first fastening groove 111. The width L2 of the catching protrusion of the first catching part 211 may be smaller than the width L1 of a portion of the first fastening groove 111 where the catching protrusion is located. The catching protrusion of the first fastening groove 111 is overlapped with one surface of the first fastening groove 111 where the catching protrusion is located, thereby preventing the fan module 20 from being separated.

The second fan module side plate 220 includes a second catching part 221, and since the detailed description of the second fan module side plate 220 and the second catching part 221 is corresponding to the detailed description of the first fan module side plate 210 and the second catching part 221, the overlapping descriptions are omitted.

The first frame side plate 110 of the power module frame 100 may include a first guide part 112. The first guide part 112 is disposed perpendicular to the first frame side plate 110 and may be extended a predetermined length into the power module frame 100. The first guide part 112 may guide coupling of the fan module 20 when the fan module 20 is slidably coupled to the power module frame 100. The first guide part 112 may be in contact with one surface of the fan module frame 200. The first guide part 112 can support the bottom surface of the fan module 20 and can prevent the fan module 20 from separating towards the lower side of the power module frame 100. The first guide part 112 may be connected to the end portion 130 of the lower plate 150 of the power module frame 100. The first guide part 112 may be disposed spaced apart from the end portion 130 of the lower plate 150 of the power module frame 100.

The second frame side plate 120 may include a second guide part 122. The second guide part 122 may be formed in a shape symmetrical to that of the first guide part 112, or may be formed in a different shape. Since the description of the second guide part 122 corresponds to the description of the first guide part 112, overlapping descriptions are omitted. The second guide part 122 formed in the second frame side plate 120 may be formed by bending a portion of a region where the second frame side plate 120 and the lower plate 150 are being connected.

The first frame side plate 110 may include a screw-fastening part 113. The screw-fastening part 113 may increase fixing force when the first frame side plate 110 and the fan module 20 are coupled. The screw-fastening part 113 may be formed in a hole shape in the first frame side plate 110. The first fan module side plate 210 of the fan module 20 may include a hole 212 corresponding to the screw-fastening part 113 of the first frame side plate 110. The center of the screw-fastening part 113 may be disposed on the axis of symmetry of the first fastening groove 111.

The fan module frame 200 may be disposed on both side surfaces of the fan 21, and may have a structure in which the upper, lower, and rear surfaces are open. The fan module frame 200 may include a minimum plate for coupling with and supporting the fan 21, but is not particularly limited thereto.

The fan module frame 200 may include a third fan module plate 230 being formed by connecting one end of the first fan module side plate 210 and one end of the second fan module side plate 220. The third fan module plate 230 may be formed at an opposite direction being coupled with the power module frame 100 when coupled with the power module frame 100. The third fan module plate 230 may have at least one hole 231 for a screw 240 for screw-coupling with the fan 21. A handle for a user to hold to connect or separate the fan module 20 from the power module 10 may be formed in the third fan module plate 230.

FIGS. 7 and 8 are views illustrating the double fan module 30 in which the double fan 21 is coupled to the fan module frame 200.

The double fan module 30 is a single fan module 20 coupled with an additional fan 21, and the added fan 21 may be coupled to each other in a direction in which the fan module 20 is coupled to the power module frame 100. The first and second fan module side plates 210 and 220 of the double fan module 30 may be formed by being extended a predetermined length in a direction being coupled with the power module frame 100 rather than the side plate of the single fan module 20. The first and second fan module side plates 210 and 220 may have different lengths in a direction being coupled with the power module frame 100 according to the number of fans 21. Even if the first and second fan module side plates 210 and 220 have different lengths in a direction being coupled with the power module frame 100, the position of the catching parts 211 and 221 of the single fan module 20 and the double fan module 30, the positions of the catching parts 211 and 221 may be the same. Accordingly, even if the type of fan module being coupled to the power module 10 is changed, the structure of the power module frame 100 and the internal arrangement of components of the power module 10 do not need to be changed. When the double fan module 30 is coupled to the power module 10, the single fan module 20 may be protruded from the front surface of the power module 10 to be coupled rather than the single fan module 20 is coupled. Since the third fan module plate 230 of the double fan module 30 is formed to correspond to the front surface of the fan 21, the shape of the third fan module plate 230 may be the same even if the number of fans 21 is changed. In addition, since the detailed description of the double fan module 30 corresponds to the description of the single fan module 20 described previously, overlapping descriptions will be omitted.

FIG. 9 is a perspective view in which a fan module is separated from a power module according to another embodiment of the present invention. Referring to FIG. 9, the fan module 20 may be slidably coupled from an upper surface of the power module 10 to a lower surface. Since the description of the fastening groove and catching part described previously is a description of the case where the fan module 20 is slidably coupled in a direction from a front surface to a rear surface of the power module 10, when the fan module 20 is slidably coupled in a direction from an upper surface to a lower surface of the power module, corresponding to this, the shape of the fastening groove and catching part may be changed.

Hereinafter, with reference to FIGS. 10 to 17, an LED and a lever disposed in a power module according to an embodiment of the present invention will be described.

The power module frame 100 may include a side plate 140 and a lower plate 150. The side plate 140 and the lower plate 150 may be disposed perpendicular to each other. The side plate 140 and the lower plate 150 may be fixed by welding or screw-coupling of separate plates. The side plate 140 and the lower plate 150 may be fixed by welding or screw-coupling by bending the planar figure of the power module frame 100 being formed of a single plate.

An AC socket 500 and a fan module 20 may be disposed at the front part of the power module frame 100. The length of the side plate 140 of the power module frame in a direction perpendicular to the ground, and the length of the lower plate 150 in a direction perpendicular to the side plate 140 may vary depending on the size of the AC socket 500 and fan module 20.

Referring to FIG. 2 illustrating a front view of the power module 10, a fan module 20 and an AC socket 500 may be disposed on the front surface of the power module frame 100. The size of the AC socket 500 depends on the size of the input AC power, and the size of the AC power source depends on the amount of power. Recently, as the power capacity of power modules increases, large AC power sources and large size AC sockets are required.

The fan module 20 is disposed on the front surface of the power module 10, and the size of the AC socket 500 being disposed in the remaining area is maximally secured, but the lever 300 and the LED 600 can be disposed together. To this end, the lever 300 may be disposed below the AC socket 500, and the LED 600 may be disposed at the side portion of the AC socket 500. The bracket 400 supporting the LED 600 and the first plate 310 of the lever 300 are in contact with a first surface of the AC socket 500, and the second plate 320 of the lever 300 may be in contact with a second surface of the AC socket 500, and the first surface and second surface of the AC socket 500 may be vertically disposed.

The AC socket 500 may be spaced apart from the side plate 140 of the power module frame 100 by a predetermined distance. The predetermined distance D1 between the AC socket 500 and the side plate 140 may be larger than the length D2 of which the lever hook 311 being protruded from the first plate 310 of the lever 300 in a direction perpendicular to the first plate 310. This is to secure a space where the lever hook 311 is inserted into the power module frame 100 when the handle 340 of the lever 300 is moved toward an inner side direction which is perpendicular to the side plate 140 of the power module frame 100. A predetermined distance D1 between the AC socket 500 and the side plate 140 may be larger than the diameter D3 of an LED 600. An LED hole 142 may be formed between the AC socket 500 and the side plate 140, and the LED 600 may be inserted into the LED hole 142 and supported.

The power module 10 may include a bracket 400. The bracket 400 may support the LED 600. The bracket 400 may support the LED 600 so as to be protruded out of the power module frame 100.

The bracket 400 may include a support 430 for supporting the LED 600. The support portion 430 where the bracket 400 is formed at a position facing the front surface of the power module frame 100 is formed in a shape corresponding to the outer circumferential surface of the LED 600 to support the LED 600. The support portion 430 may include a fixing groove 431. In the LED 600, a flange 601 may be formed at a portion where epoxy and a lead wire are coupled. The flange 601 of the LED 600 may have a larger outer circumferential surface than the outer circumferential surface of the epoxy of the LED 600. The fixing groove 431 of the support portion 430 may be formed in a shape corresponding to the flange 601 of the LED 600 to support the LED 600. The LED 600 may be fit-coupled to the fixing groove 431 of the support portion 430. Thus, within the bracket 400, the LED 600 can be fixed or supported without being separated in the front and rear directions.

The LED 600 may externally display the operating state of the power module 10. The LED 600 can emit green or yellow (amber) colors and can be transformed into various colors. The LED 600 may be turned on in a specific color and may blink at a specific cycle. The user can check the operating state of the power module 10 by looking at the state of the LED 600, and can take action accordingly.

The bracket 400 may be coupled to the side plate 140 of the power module frame 100. The bracket 400 may be slidably coupled to the side plate 140 toward the front surface of the power module frame 100. The side plate of the power module frame 100 may include a bracket coupling plate 144 in which a bracket groove 141 is formed. The bracket groove 141 may be formed in a shape corresponding to the bracket hooks 411 and 421. The bracket coupling plate 144 may be protruded in a wing shape from the side plate 140 of the power module frame 100 in an inward direction. The bracket coupling plate 144 may be formed by being bent from the side plate 140 of the power module frame 100 toward an inner side direction of the power module frame 100.

The upper surface 410 of the bracket 400 may include a first bracket hook 411. The first bracket hook 411 may be coupled to the bracket groove 141 being formed in the bracket coupling plate 144. The first bracket hook 411 may be formed by being protruded from the upper surface 410 of the bracket 400. The first bracket hook 411 may include: a first surface 411a parallel to the upper surface 410 of the bracket 400; and a second surface 411b on which a downwardly inclined surface is formed in a direction in which the bracket 400 is slidably coupled. When the bracket 400 is slidably coupled to the bracket coupling plate 144, it can be easily coupled through the second surface 411b, and an end portion of the first surface 411a may be fit-coupled into the bracket groove 141. One end portion of the first bracket hook 411 is fit-coupled to the bracket groove 141 so that movement in a rearward direction may be restricted.

The lower surface 420 of the bracket 400 is symmetrical with the upper surface 410 of the bracket 400 about the body of the bracket 400, and the lower surface 420 of the bracket may include a second bracket hook 421. A description of the second bracket hook 421 may be replaced with a description of the first bracket hook 411.

A first tension groove 412 may be formed between the upper surface 410 of the bracket 400 and the body 440. The first tension groove 412 being formed spaced apart at a predetermined interval may be included between the upper surface 410 of the bracket 400 and the body 440. The first tension groove 412 may be formed in a predetermined space so that the upper surface 410 of the bracket 400 can be elastically movable toward the body 440 side when the first bracket hook 411 is slidably coupled into the bracket groove 141.

A second tension groove 422 may be formed between the lower surface 420 of the bracket 400 and the body 440. A second tension groove 422 being formed at a predetermined interval may be included between the lower surface 420 of the bracket 400 and the body. The second tension groove 422 may be formed in a predetermined space so that the lower surface 420 of the bracket 400 is elastically movable toward the body 440 side when the second bracket hook 421 slidably coupled into the bracket groove 141.

The power module 10 may include a lever 300. The lever 300 is a component for coupling the power module 10 to a device included in the data center. When the handle 340 of the lever 300 is pulled in an inward direction perpendicular to the side plate of the power module frame 100, the lever hook 311 of the lever 300 can separate the power module 10 as it enters inside the power module frame 100, and when the lever hook 311 is being protruded from the power module frame 100 as the handle 340 of the lever 300 is returned in place, it can be coupled to a device being included in the data center.

The lever 300 may include a first plate 310, a second plate 320, a third plate 330, and a handle 340. The first plate 310 may be disposed parallel to the side plate 110 of the power module frame 100. The first plate 310 may be in contact with the side plate 110 of the power module frame 100. The first plate 310 may include at least one lever hook 311. The lever hook 311 is inserted into the lever groove 143 formed in the side plate 110 of the power module frame 100 and may be protruded to be exposed to the outside of the power module frame 100. The first plate 310 may include at least one hole 312. The hole 312 of the first plate 310 may correspond to a hole formed in the side plate 110 of the power module frame 100. The power module frame 100 and the lever 300 may be coupled by coupling a screw (not shown) in a hole formed at a corresponding position, or a portion of the power module frame 100 is bent and the bent portion (not shown) may be fixed and coupled in a manner of press fitting into/inside the one hole 312 of the first plate 310.

The second plate 320 may be vertically connected to the first plate 310. The second plate 320 may be disposed parallel to the lower plate 120 of the power module frame 100. The second plate 320 may be in contact with the lower plate 120 of the power module frame 100. A first connecting portion 313 may be disposed between the lower end of the first plate 310 and the second plate 320. Since the second plate 320 may be disposed while forming a step with the lower end of the first plate 310, the second plate 320 may be connected to the first plate 310 by the first connecting portion 313. The second plate 320 may be disposed in a space formed between the AC socket 400 and the lower plate 120 of the power module frame 100, and may be freely moved within the space.

The third plate 330 may be connected to the second plate 320 and may be disposed to be exposed to the outside of the power module frame 100. A second connecting portion 321 may be disposed between the third plate 330 and the second plate 320. Since the third plate 330 and the second plate 320 may be disposed while forming a step difference, the third plate 330 may be connected to the second plate 320 by the second connecting portion 321. The third plate 330 may include a catching part 331 being formed in a vertical direction. When AC power is inserted into the AC socket 400, the movement of the lever 300 may be limited by the AC power and the catching part 331. Through this, it is possible to prevent the power module 10 from being separated from devices included in the data center while the power module 10 is operating with AC power inserted. That is, when the lever 300 is moved when AC power is inserted into the AC socket 400, the catching part 331 of the lever 300 is caught in the AC power, so that it helps to maintain the state in which the power module 10 is coupled to the data center.

The handle 340 may be connected to the third plate 330. The handle 340 is a part that the user grips when moving the lever 300 and may be made of a material that does not conduct current to prevent electric conduction or electric shock, but is not particularly limited thereto.

Although the embodiment of the present invention has been described above with reference to the accompanying drawings, those of ordinary skill in the art to which the present invention belongs will understand that the present invention may be embodied in other specific forms without changing the technical spirit or essential features thereof. Therefore, it should be understood that the embodiments described above are illustrative in all respects and not restrictive.

The invention claimed is:

1. A power module frame comprising:
   a first frame side plate, the first frame side plate including:
      at least one fastening groove configured to be coupled to a catching part formed on a first side plate of a fan module; and
      a guide part extending by a predetermined length from a lower end of the first frame side plate;
   a second frame side plate facing the first frame side plate, the second frame side plate including:
      at least one fastening groove configured to be coupled to a catching part formed on a second side plate of the fan module; and
      a guide part extending by a predetermined length from a lower end of the second frame side plate to face the guide part of the first frame side plate, the guide parts of the first frame side plate and the second side frame plate being configured to support a lower surface of the fan module; and
   a lower plate, the lower plate being opened in a first direction perpendicular to a direction to which the fan module is insertable, and corresponding to a region into which the fan module is insertable,
   wherein the first frame part side plate includes a screw-fastening part configured to couple the first frame side plate to the fan module.

2. The power module frame according to claim 1, wherein an end portion of a lower end of the power module frame is in contact with one surface of the fan module.

3. The power module frame according to claim 1, wherein the at least one fastening groove of the first frame side plate and the at least one fastening groove of the second side plate face each other.

4. The power module frame according to claim 1, wherein the at least one fastening groove of the first frame side plate comprises a first fastening groove and a second fastening groove, and
   wherein a center of the screw-fastening part is disposed on an axis of symmetry of the first fastening groove.

5. The power module frame according to claim 4, wherein the first fastening groove is spaced apart from the second fastening groove in a second direction perpendicular to the insertion direction of the fan module.

6. The power module frame according to claim 1, wherein each of the at least one fastening grooves of the first frame side plate and the second frame side plate comprises a first portion and a second portion,
wherein a width of the second portion is wider than a width of the first portion, and
wherein a catching protrusion of each of the catching parts of the first side plate and the second side plate is located at a corresponding second portion of the first frame side plate and the second side frame plate.

7. The power module frame according to claim 1, wherein an upper plate of the power module frame is opened corresponding to the region into which the fan module is insertable.

8. A power supply device comprising:
a power module, the power module including a power module frame having:
a first frame side plate;
a second frame side plate; and
a lower plate; and
a fan module coupled to the power module, the fan module including:
one or more fans;
a first fan module side plate and a second fan module side plate formed on opposite side surfaces of the fan module and facing each other; and
a third fan module plate formed by connecting one end of the first fan module side plate and one end of the second fan module side plate, and
wherein the first fan module side plate includes at least one catching part fit-coupled into a fastening groove formed on the first frame side plate,
wherein the second fan module side plate includes at least one catching part fit-coupled into a fastening groove formed on the second frame side plate, and
wherein the lower plate of the power module frame is opened in a first direction perpendicular to a direction to which the fan module is inserted, and corresponding to a region into which the fan module is inserted.

9. The power supply device according to claim 8, wherein the at least one catching part is extended outward from the first fan module side plate or the second fan module side plate at a predetermined angle.

10. The power supply device according to claim 8, wherein the first fan module side plate and the second fan module side plate have different lengths according to the number of fans.

11. The power supply device according to claim 10, wherein the first fan module side plate and the second fan module side plate have different lengths in the insertion direction of the fan module, but the position of the catching part is the same.

12. The power supply device according to claim 8, wherein the first fan module side plate comprises a hole fastened with a screw when the fan module and the first frame side plate are coupled.

13. The power supply device according to claim 8, wherein the first frame side plate includes a guide part extending by a predetermined length from a lower end of the first frame side plate,
wherein the second frame side plate includes a guide part extending by a predetermined length from a lower end of the second frame side plate to face the guide part of the first frame side plate,
wherein the guide parts of the first frame side plate and the second side frame plate support a lower surface of the fan module, and
wherein the first frame side plate comprises a screw-fastening part coupling the first frame side plate to the fan module.

14. The power supply device according to claim 13, wherein an end portion of a lower end of the power module frame is in contact with one surface of the fan module.

15. The power supply device according to claim 13, wherein the at least one fastening groove of the first frame side plate and at least one fastening groove of the second frame side plate face each other.

16. The power supply device according to claim 13, wherein the at least one fastening groove of the first frame side plate comprises a first fastening groove and a second fastening groove, and
wherein a center of the screw-fastening part is disposed on an axis of symmetry of the first fastening groove.

17. The power supply device according to claim 16, wherein each of the at least one fastening grooves of the first frame side plate and the second frame side plate comprises a first portion and a second portion,
wherein a width of the second portion is wider than a width of the first portion, and
wherein a catching protrusion of each of the catching parts of the first side plate and the second side plate is located at a corresponding second portion of the first frame side plate and the second side frame plate.

18. The power supply device according to claim 13, wherein an upper plate of the power module frame is opened corresponding to the region into which the fan module is inserted.

* * * * *